United States Patent
Burke et al.

(10) Patent No.: US 10,593,664 B2
(45) Date of Patent: Mar. 17, 2020

(54) CONTROLLED RESISTANCE INTEGRATED SNUBBER FOR POWER SWITCHING DEVICE

(71) Applicant: Infineon Technologies Americas Corp., El Segundo, CA (US)

(72) Inventors: Hugo Burke, Llantrisant (GB); Kapil Kelkar, Torrance, CA (US); Ling Ma, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/391,374

(22) Filed: Dec. 27, 2016

(65) Prior Publication Data

US 2018/0182750 A1    Jun. 28, 2018

(51) Int. Cl.
*H01L 27/06* (2006.01)
*H01L 23/522* (2006.01)
(Continued)

(52) U.S. Cl.
CPC ...... *H01L 27/0629* (2013.01); *H01L 23/5226* (2013.01); *H01L 23/5228* (2013.01);
(Continued)

(58) Field of Classification Search
None
See application file for complete search history.

(56) References Cited

U.S. PATENT DOCUMENTS 7,768,064 B2    8/2010   Sapp et al.
2012/0292694 A1  11/2012  Hsieh
(Continued)

FOREIGN PATENT DOCUMENTS

JP    2002203964 A    7/2002

OTHER PUBLICATIONS

Chen, Jingjing, "Design Optimal Built-in Snubber in Trench Field Plate Power MOSFET for Superior EMI and Efficiency Performance", SISPAD 2015, Sep. 9-11, 2015, Washington, DC; USA, pp. 459-462.

(Continued)

*Primary Examiner* — Joseph C. Nicely
*Assistant Examiner* — Lamont B Koo
(74) *Attorney, Agent, or Firm* — Murphy, Bilak & Homiller, PLLC

(57) ABSTRACT

A semiconductor substrate has a main surface, a rear surface, an active device region, and an inactive region adjacent the active device region. Doped source, body, drift and drain regions, and electrically conductive gate and field electrodes are disposed in the active device region. The gate electrode is configured to control an electrical connection between the source and drain regions. The field electrode is adjacent to the drift region. An intermetal dielectric layer is disposed on the main surface, an electrically conductive source pad is formed in a first metallization layer that is formed on the intermetal dielectric layer. A resistor is connected between the source pad and the field electrode. The resistor includes an electrically conductive resistance section that is disposed in a resistor trench. The resistor trench is formed within the inactive region and is electrically isolated from every active device within the active device region.

7 Claims, 12 Drawing Sheets

(51) Int. Cl.
| | |
|---|---|
| H01L 29/423 | (2006.01) |
| H01L 29/10 | (2006.01) |
| H01L 23/528 | (2006.01) |
| H01L 29/40 | (2006.01) |
| H01L 29/78 | (2006.01) |
| H01L 29/66 | (2006.01) |
| H01L 29/06 | (2006.01) |
| H01L 29/739 | (2006.01) |

(52) U.S. Cl.
CPC ...... *H01L 23/5283* (2013.01); *H01L 29/1095* (2013.01); *H01L 29/404* (2013.01); *H01L 29/407* (2013.01); *H01L 29/4236* (2013.01); *H01L 29/66348* (2013.01); *H01L 29/66734* (2013.01); *H01L 29/7803* (2013.01); *H01L 29/7813* (2013.01); H01L 29/0692 (2013.01); H01L 29/0696 (2013.01); H01L 29/7397 (2013.01)

(56) References Cited

U.S. PATENT DOCUMENTS

| | | |
|---|---|---|
| 2014/0084295 A1 | 3/2014 | Hirler et al. |
| 2014/0197483 A1 | 7/2014 | Burke et al. |
| 2014/0264577 A1* | 9/2014 | Rieger ............... H01L 27/0629 257/337 |
| 2015/0041816 A1 | 2/2015 | Wood et al. |
| 2016/0104773 A1 | 4/2016 | Kelkar et al. |
| 2017/0018619 A1* | 1/2017 | Ku ...................... H01L 29/407 |

OTHER PUBLICATIONS

Choi, Wonsuk et al., "New Power MOSFET Technologies Optimized for Efficient and Reliable Telecommunication Power System", Applied Power Electronics Conference and Exposition (APEC), Feb. 5-9, 2012, Twenty-Seventh Annual IEEE, 2012, pp. 1676-1681.

Roig, J. et al., "Suitable Operation Conditions for Different 100V Trench-Based Power MOSFETs in 48V-input Synchronous Buck Converters", Proceedings of the 2011 Fourteenth European Conference on Power Electronics and Applications (EPE 2011), Sep. 15, 2011, pp. 1-9.

Rutter, P. et al., "Low Voltage MOSFET Optimized for low $V_{DS}$ Transient Voltages", Proceedings of the 25th International Symposium on Power Semiconductor Devices & ICs, Kanazawa, May 26-30, 2013, pp. 83-86.

* cited by examiner

CONTROLLED RESISTANCE INTEGRATED SNUBBER FOR POWER SWITCHING DEVICE

TECHNICAL FIELD

The instant application relates to semiconductor devices and in particular relates to voltage spike protection features for power switching devices.

BACKGROUND

Semiconductor transistors, in particular field-effect controlled switching devices such as Metal Oxide Semiconductor Field Effect Transistors (MOSFET) and Insulated Gate Bipolar Transistors (IGBT) have been used in a wide variety of applications such as power supplies, power converters, electric cars and air-conditioners, Many of these applications are high power applications, which require the transistors to be able to accommodate substantial current and/or voltage, e.g., voltages in the range of 200V, 400V, 600V or more. In high power applications, two device parameters that play a substantial role in overall performance of the device are on-state resistance $R_{ON}$ and breakdown voltage $V_{BR}$. Lower on-state resistance $R_{ON}$ is a desirable characteristic because it minimizes the resistive power loss and corresponding heat generation that occurs when the device is in a forward conducting state. Meanwhile, high breakdown voltage $V_{BR}$ is a desirable characteristic because it determines how much voltage the device can safely block in an OFF state, Power transistors typically include a lightly doped drift region between the output regions (e.g., source/drain regions) to improve the breakdown voltage $V_{BR}$ of the device. In the case of a vertical switching device (i.e., a device that is configured to conduct between opposite facing main and rear surfaces of the substrate), the drift region occupies most of the thickness of the substrate. In the case of a lateral switching device (i.e., a device that is configured to conduct in a direction that is parallel to the main surface) the drift region is a relatively large lateral region between the body and drain regions. The properties of the drift region can be tailored to achieve a desired tradeoff between on-state resistance $R_{ON}$ and breakdown voltage $V_{BR}$. For example, by reducing the doping concentration of the drift region, the breakdown voltage $V_{BR}$ of the device can be improved. However, this comes at the expense of increased on-state resistance $R_{ON}$. Conversely, the doping concentration of the drift region can be increased to lower the on-state resistance $R_{ON}$ at the expense of a reduced breakdown voltage $V_{BR}$.

Field electrodes are used in power switching devices to favorably shift the tradeoff between on-state resistance $R_{ON}$ and breakdown voltage $V_{BR}$. Field electrodes are electrically conductive structures that are insulated from and run adjacent to most the drift region of the device. Field electrodes utilize the compensation principle to balance charges during operation of the device. By tying the field electrode to a fixed potential (e.g., source potential) during the OFF state of the device, charges in the drift region are compensated for by corresponding charges in the field electrode. As a result of this charge balancing, the drift region is less susceptible to avalanche breakdown mechanisms. This enables the drift region to have a higher doping concentration and thus a reduction in the on-state resistance $R_{ON}$ without detrimentally impacting the voltage blocking capability of the device.

Applications that require switching devices to drive inductive loads can place especially high requirements on the voltage blocking capability of the device. In these applications, switching the power device causes a rapid change in current flowing through the inductive load, In accordance with Ohm's law, this rapid change in current produces a large voltage at the output of the switching device. Accordingly, the switching device is exposed to potentially damaging voltage levels until the current in the inductance is dissipated.

Designers are constantly seeking ways to improve overall ruggedness of power switching devices in response to rapid switching events.

SUMMARY

A semiconductor device is disclosed, According to an embodiment, the semiconductor device includes a semiconductor substrate having a main surface, a rear surface vertically spaced apart from the main surface, an active device region, and an inactive region that is laterally adjacent to the active device region. The semiconductor device further includes a switching device disposed in the active device region. The switching device includes doped source, body, drift and drain regions, and electrically conductive gate and field electrodes. The gate and field electrodes are insulated from one another and from the substrate. The gate electrode is adjacent to the body region and is configured to control an electrical connection between the source and drain regions. The field electrode is adjacent to the drift region. The semiconductor device further includes an intermetal dielectric layer disposed on the main surface over the active and inactive regions, an electrically conductive source pad formed in a first metallization layer, the first metallization layer being formed on the intermetal dielectric layer, and a resistor connected between the source pad and the field electrode. The resistor includes an electrically conductive resistance section that is disposed in a resistor trench. The resistor trench vertically extends from the main surface into the semiconductor substrate. The resistor trench is formed within the inactive region and is electrically isolated from every active device within the active device region.

According to another embodiment, the semiconductor device includes a semiconductor substrate having a main surface, a rear surface vertically spaced apart from the main surface, an active device region, and an inactive region that is laterally adjacent to the active device region. The semiconductor device further includes electrically conductive source and drain terminals, and a switching device disposed in the active device region. The switching device includes a gate electrode and a field electrode. The gate electrode is configured to control an electrical connection between the source and drain terminals. The field electrode is configured to provide compensating charges in the drift region during a voltage blocking state of the device. The semiconductor device further includes an RC snubber connected between the source and drain terminals in parallel with the switching device. A resistance of the RC snubber is substantially provided by a resistor that is connected between the field electrode and the source terminal. The resistor is formed in the inactive region and is electrically isolated from every active device within the active device region.

A method of forming a semiconductor device is formed. According to an embodiment, the method includes providing a semiconductor substrate having a main surface, a rear surface vertically spaced apart from the main surface, an active device region, and an inactive region that is laterally adjacent to the active device region. The method further includes forming a switching device in the active device region. The switching device includes doped source, body, drift and drain regions, and electrically conductive gate and field electrodes, the gate and field electrodes being insulated from one another and from the substrate. The gate electrode is adjacent to the body region and is configured to control and electrical connection between the source and drain regions. The field electrode is adjacent to the drift region. The method further includes forming an intermetal dielectric layer disposed on the main surface over the active and inactive regions, and forming an electrically conductive source pad in a first metallization layer. The first metallization layer is formed on the intermetal dielectric layer. The method further includes forming a resistor that is connected between the source pad and the field electrode of the switching device. Forming the resistor includes forming an electrically conductive resistance section that is disposed in a resistor trench. The resistor trench is formed within the inactive region and is electrically isolated from every doped device region within the active device region.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
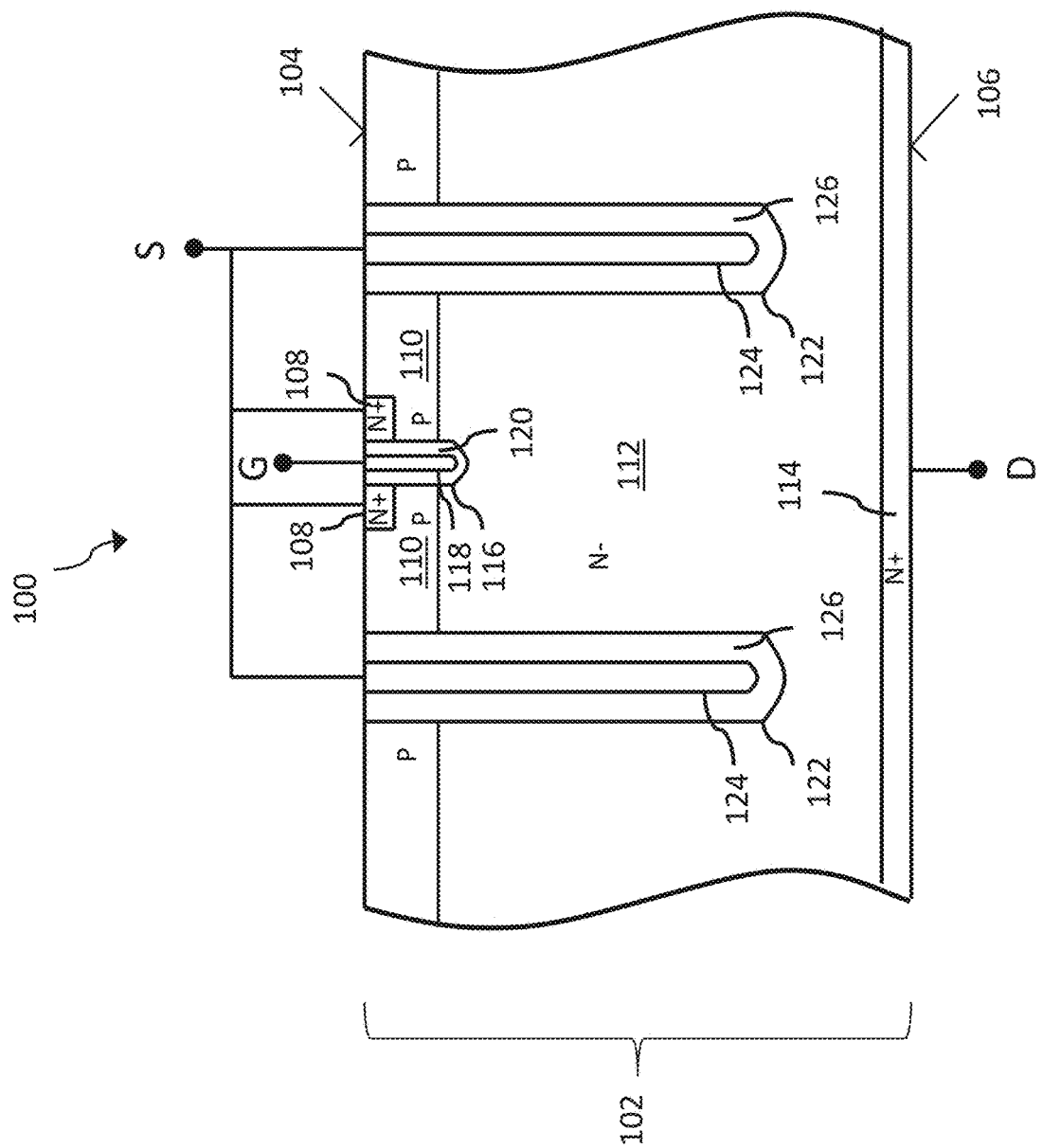
FIG. 1 illustrates a cross-sectional view of a power switching device, according to an embodiment.

Referring to FIG. 1, a partial cross-sectional view of a power switching device 100 is depicted, according to an embodiment. The semiconductor device 100 is formed in a semiconductor substrate 102. The substrate 102 includes a main surface 104 and a rear surface 106 vertically spaced apart from the main surface 104. The semiconductor substrate 102 may include one or more of a variety of semiconductor materials that are used to form integrated circuit devices, such as silicon (Si), silicon carbide (SiC), germanium (Ge), a silicon germanium crystal (SiGe), gallium nitride (GaN), gallium arsenide (GaAs), and the like. The semiconductor substrate 102 may be a bulk semiconductor material or alternatively may include one or more epitaxially grown layers.

The semiconductor device 100 includes an n-type source region 108 disposed at the main surface 104, a p-type body region 110 disposed beneath the source region 108, an n-type drift region 112 disposed beneath the body region, and an n-type drain region 114 that is disposed beneath the drift region 110 and extends to the rear surface 106.

The device 100 further includes a gate trench 116 vertically extending from the main surface 104 into the semiconductor substrate 102. The gate trench 116 vertically extends through the source region 108 and through the body region 110 and is thus disposed between sections of the source and body regions 108, 110. A gate electrode 118 is disposed in the gate trench 116. The gate electrode 118 is formed from an electrically conductive material, such as polysilicon or a conductive metal, such as aluminum or tungsten. The gate electrode 118 is dielectrically insulated from the substrate 102 by a gate dielectric 120, The gate dielectric 120 may be a layer of oxide such as silicon dioxide ($SiO_2$) that is formed along the sidewalls of the gate trench 116.

The device 100 further includes field electrode trenches 122 that vertically extend from the main surface 104 into the semiconductor substrate 102 and are laterally spaced apart from the gate trench 116. The field electrode trenches 122 vertically extend into the drift region 112 by a substantial amount (e.g., 50% of a thickness of the drift region 112 or more). A field electrode 124 is disposed in each field electrode trench 122. The field electrode 124 is formed from an electrically conductive material, such as polysilicon or a conductive metal, such as aluminum or tungsten. The field electrode 124 is dielectrically insulated from the substrate 102 by a field electrode dielectric 126. The field electrode dielectric 126 may be a layer of oxide such as silicon dioxide ($SiO_2$) that is formed in the field electrode 124 trench. The field electrode 124 is adjacent to the drift region 112 and overlaps with the drift region 112 in the direction of conduction (vertical in the case of the depicted device) and is only separated from the drift region 112 by the field electrode dielectric 126.

A gate potential is applied to the gate electrode 118 by a gate terminal (G) that is in low-ohmic contact with the gate electrode 118. Source and drain potentials are applied to the source and drain regions, 108, 114, respectively, by source (S) and drain terminals (D) that are in low-ohmic contact with the source and drain regions 108, 114. In a commonly known manner, the gate electrode 118 is configured to control a conduction state of a channel in the body region 112 and carry out a switching operation for the device 100. That is, the gate electrode 118 can be biased relative to a source potential to form or remove an electrically conductive channel in the body region 112 thereby providing ON/OFF control of the device 100.

Figure 2:
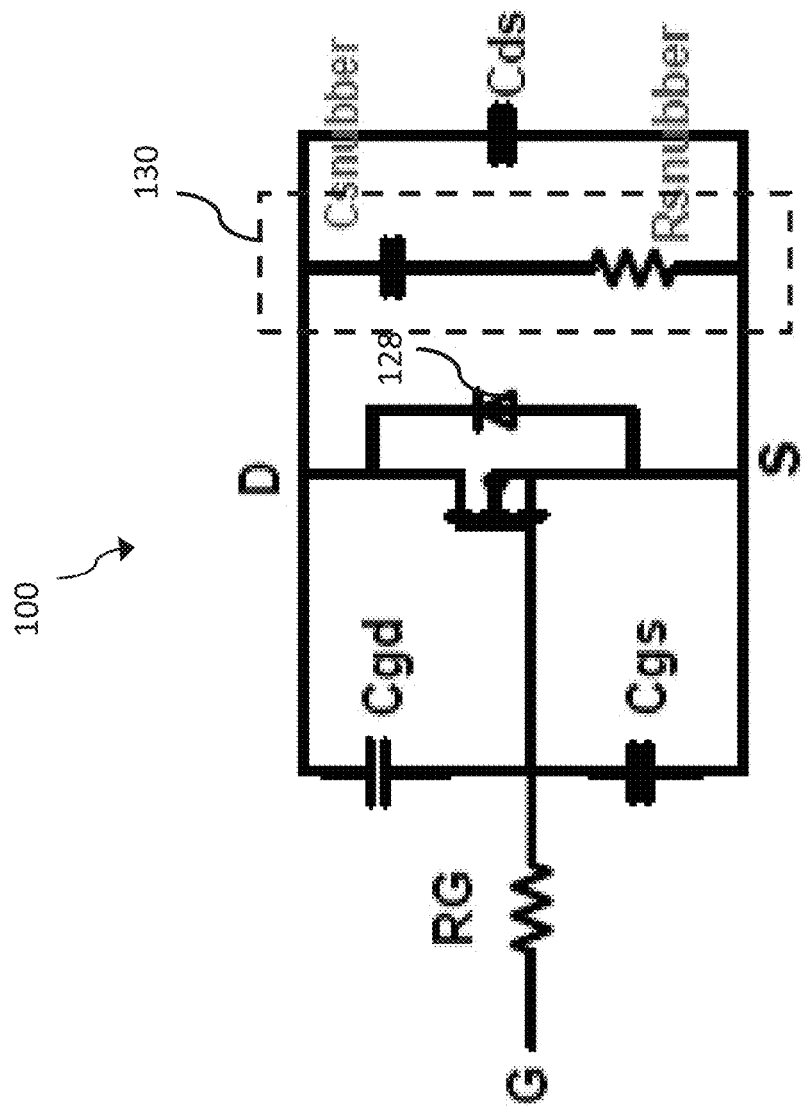
FIG. 2 illustrates an electrical schematic of a switching device with parasitic resistance and capacitances, according to an embodiment.

Referring to FIG. 2, an equivalent electrical schematic of the switching device 100 and parasitic effects is depicted. The device includes intrinsic capacitances associated with the gate-drain capacitance ($C_{GD}$), gate-source capacitance ($C_{GS}$) and drain-source capacitance ($C_{GD}$) of the switching device 100, as well as an intrinsic resistance associated with the electrical connection between the gate terminal (G) and the gate electrode 118 ($R_G$). An intrinsic body diode 128 that is antiparallel to drain (D) and source (S) terminals of the MOSFET device arises from the p-n junction between the body and drift region 110, 112. In addition, the switching device 100 includes an RC branch in parallel with the drain (D) and source (5) terminals of the MOSFET. This RC branch is attributable to the field electrode 124 of the device 100. The RC branch includes a capacitance associated with the field electrode-drain capacitance of the device ($C_{SNUBBER}$), and a resistance associated with the conductive connection between the source terminal (S) and the field electrode 124 ($R_{SNUBBER}$).

The resistor ($R_{SNUBBER}$) and capacitor ($C_{SNUBBER}$) that arise from the field electrode 124 provide an inherent RC snubber 130 in parallel with the output terminals of the switching device 100. In general, snubbers are useful as voltage protection circuits. For instance, in an electrical system in which the switching device 100 is driving an inductive load, a switching event will suddenly interrupt the current flowing through the inductive load. In the absence of a protection mechanism, this sudden change in current will result in a potentially damaging voltage spike. The resistance and capacitance of the RC snubber 130 prevent the current flowing through the inductive load from rapidly discharging and provide an alternate current path for the current to dissipate more slowly. Thus, the RC snubber 130 shields the MOSFET from potentially damaging voltage spikes that are attributable to rapid changes in current flowing through the inductive load.

The resistance of the RC snubber 130 plays an important role in the voltage protection capability of the RC snubber 130. Accordingly, the design of the switching device 100 should seek to optimize the intrinsic resistance associated with the conductive connection between the source terminal and the field electrode 124 ($R_{SNUBBER}$) with respect to the voltage protection capability of the RC snubber 130. One conventional technique for tailoring the resistance of the RC snubber 130 involves controlling the physical dimensions of the field electrode 124 described with reference to FIG. 1. By adjusting the physical characteristics of the field electrode 124, for example, a desired resistance can be achieved. However, reliable resistance control has become increasingly more difficult in modern power semiconductor device technology. One reason for this is that the physical dimensions of the field electrode 124 are difficult to control. The width and depth of the field electrode trench 122 can vary substantially, e.g., 10% or more. Furthermore, the thickness of the field electrode dielectric 126 on either side of the field electrode 124 can vary substantially, e.g., 10% or more. Each of these variations compound with one another, leading to variation of 50% or more in the resistance of the field electrode 124. This uncertainty in controlling the resistance of the field electrode 124 means that the resistance of the RC snubber 130 is highly uncontrollable.

Figure 3:
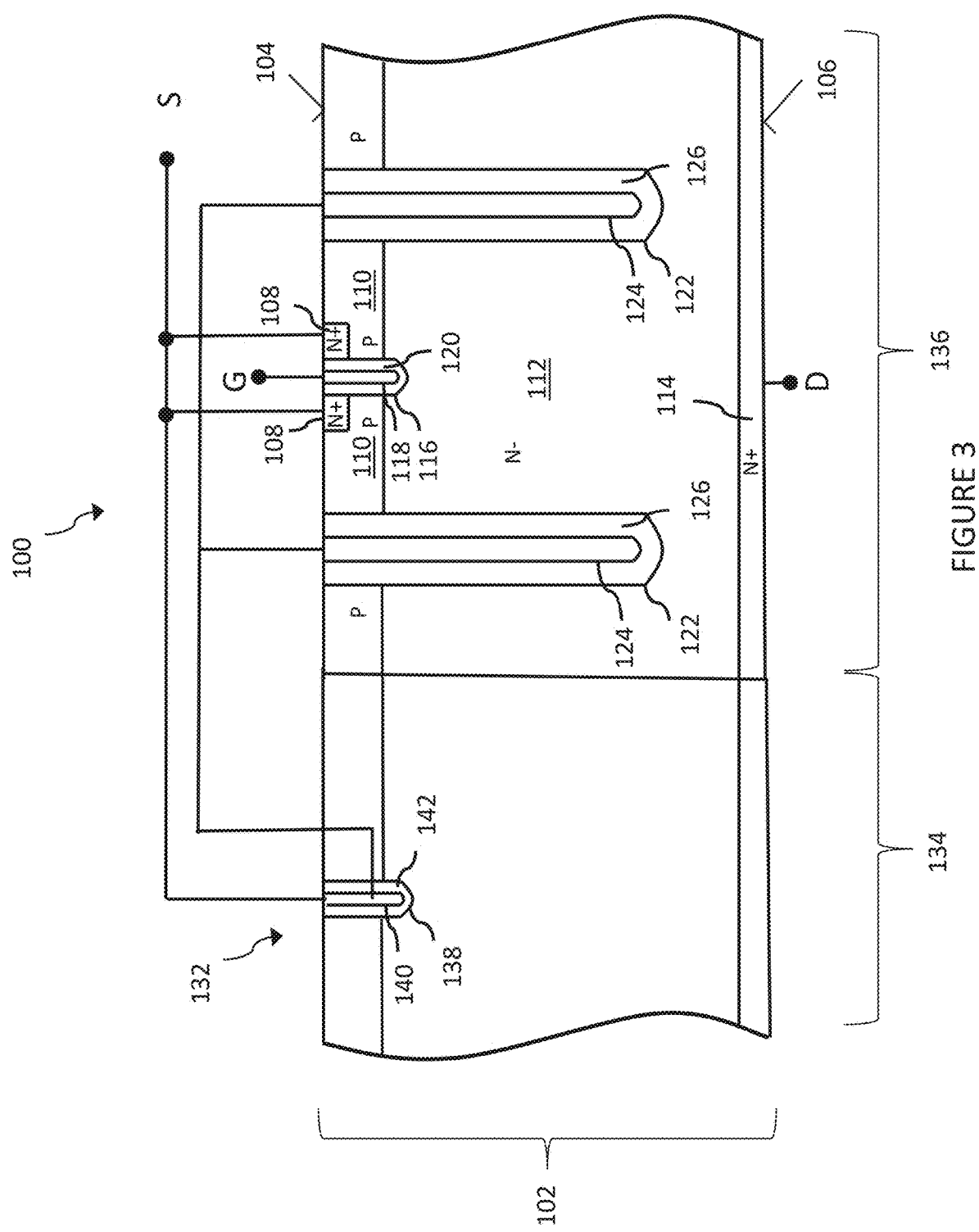
FIG. 3 illustrates a cross-sectional view of a power switching device with a discrete resistor that is part of an integrated RC snubber and is formed in an inactive region, according to an embodiment.

Referring to FIG. 3, a power switching device 100 is depicted, according to another embodiment. In this embodiment, the power switching device 100 includes an additional resistor 132 connected between the source terminal (S) and the field electrode 124. This resistor 132 is distinct from the field electrode 124, and introduces additional intentional resistance in the electrical connection between the source terminal (S) and the field electrode 124. Thus, the resistor 132 contributes to the resistance value ($R_{SNUBBER}$) of the RC snubber 130.

According to an embodiment, the resistor 132 is provided in an inactive region 134 of the substrate 102. The inactive region 134 is a section of the substrate 102 that is laterally adjacent to the active device region 136. The active device region 136 refers to a section of the substrate 102 that includes one or more active switching devices, such as the semiconductor device 100 described herein.

In general, the active device region 136 can include any of a variety of semiconductor devices, including, but not limited to, transistors, thyristors, insulated gate bipolar transistors, diodes, etc. The active device region 136 incudes doped semiconductor device regions associated with these device types, e.g., source, drain, collector, emitter, anode, and cathode regions, etc. By contrast, the inactive region 134 is devoid of active switching devices. Thus, the inactive region 134 is devoid of at least some of the doped regions of the active device region 136, such as source regions. Any devices formed in the inactive region 134 are electrically isolated from the devices disposed in the active device region 136. Thus, in the depicted embodiment, the resistor 132 that is provided in an inactive region 134 does not influence the gate control of the device 100, nor does it electrically influence the charges in the drift region 112 during operation of the device 100.

The resistor 132 includes a resistor trench 138 that vertically extends from the main surface 104 into the semiconductor substrate 102. The resistor trench 138 is formed in the inactive region 134 and thus does not adjoin any source regions. A resistance section 140 is disposed in the resistor trench 138. The resistance section 140 is formed from an electrically conductive material, such as polysilicon or a conductive metal, such as aluminum or tungsten. According to an embodiment, the resistance section 140 is dielectrically insulated from the substrate 102 by a resistance trench dielectric. The resistance trench dielectric may be a layer of oxide such as silicon dioxide ($SiO_2$) that is formed in the resistor trench 138.

Figure 4:
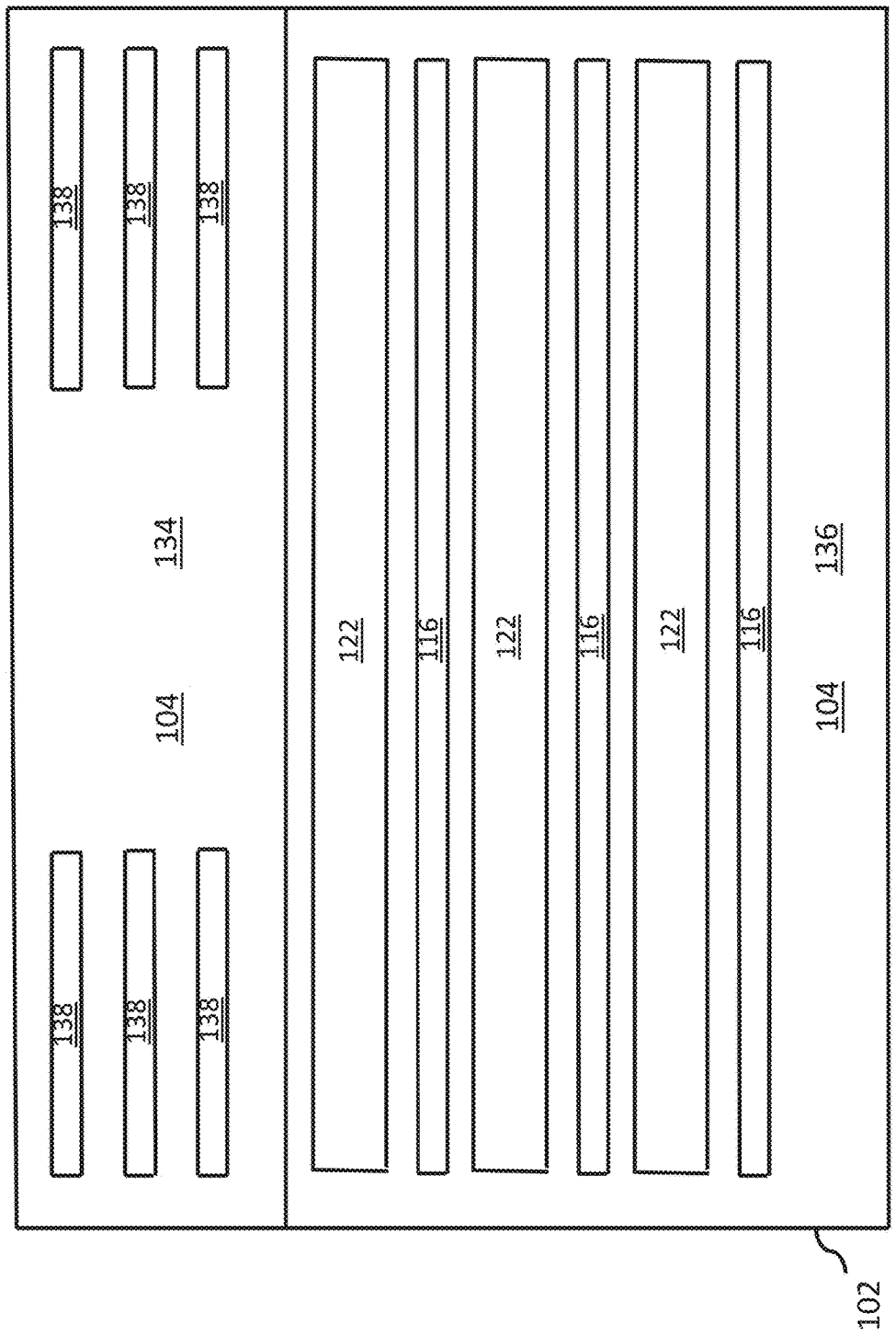
FIG. 4 illustrates a plan-view of a substrate with gate trenches, field electrode trenches and resistor trenches, according to an embodiment.

Referring to FIG. 4, a plan view of the main surface 104 of the substrate 102 is depicted so as to illustrate one potential layout of the gate, field electrode, and resistor trenches 116, 122, 138 according to an embodiment.

Figure 5:
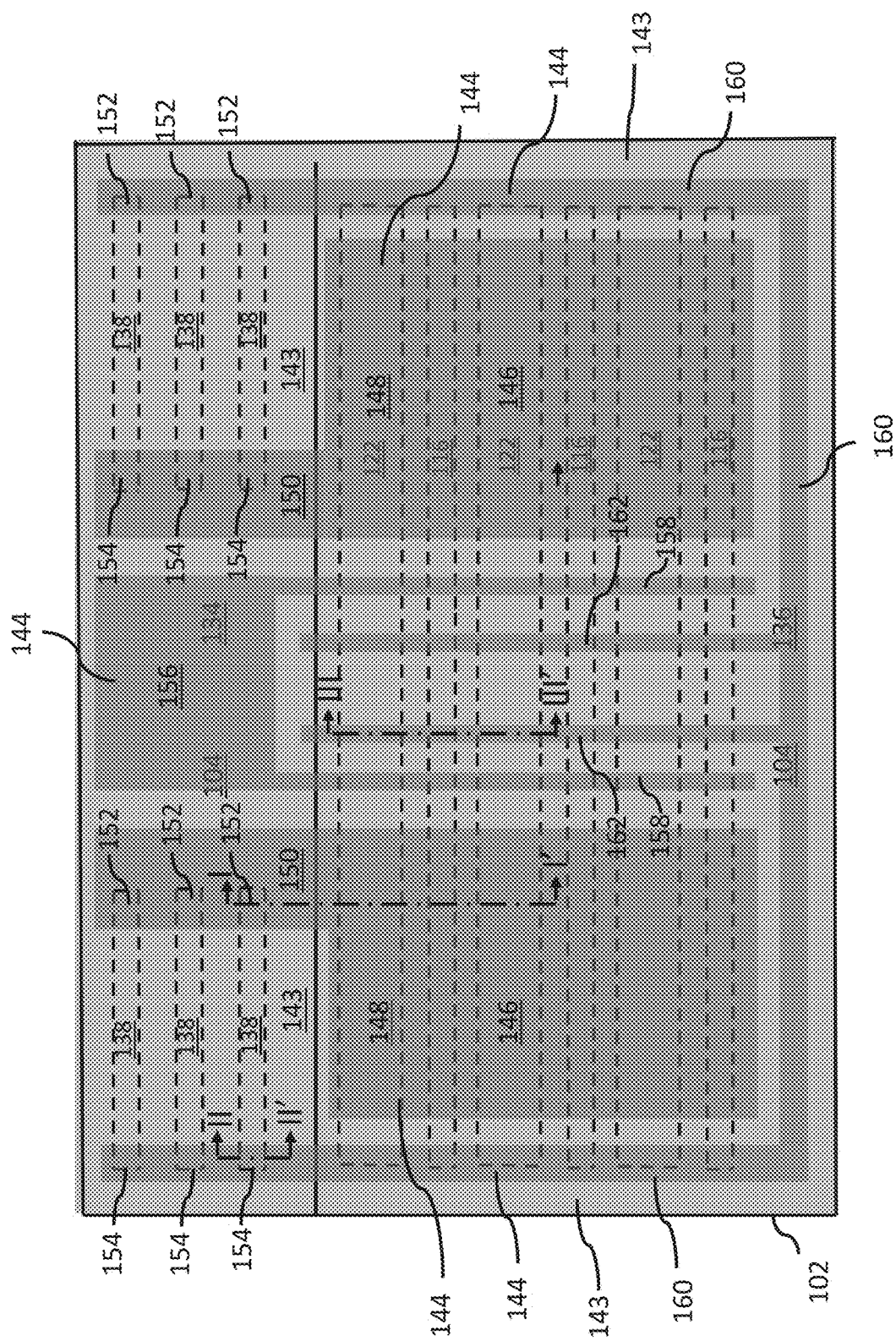
FIG. 5 illustrates a plan-view of the substrate depicted in FIG. 4 with an interlayer dielectric and a first metallization layer being formed on the substrate.

Referring to FIG. 5, a plan view of the power switching device 100 with an intermetal dielectric layer 143 and a first metallization layer 144 being formed on the main surface 104 of the substrate 102 is depicted, according to an embodiment. The first metallization layer 144 can be formed from any of a variety of conductive metals including copper, aluminum and alloys thereof. An intermetal dielectric layer 143 is disposed between the first metallization layer 144 and the semiconductor substrate 102. According to an embodiment, the intermetal dielectric layer 143 is formed directly on the semiconductor substrate 102 and the first metallization layer 144 is formed directly on the intermetal dielectric layer 143. The intermetal dielectric layer 143 can be formed from any of a variety of electrical insulators including semiconductor nitrides, semiconductor oxides, and semiconductor oxynitrides such as silicon nitride (SiN), silicon dioxide ($SiO_2$), and silicon oxynitride ($SiO_xN_y$).

An electrically conductive source pad 146 is formed in the first metallization layer 144. The source pad 146 provides the source terminal (S) of the power switching device 100. The source pad 146 is shaped in such a way to extend directly over those regions of the substrate 102 that require electrical connection to the source terminal (S). More particularly, the source pad 146 includes a first rectangular section 148 that covers the active device region 136 and extends directly over the source regions 108, which are disposed on either side of the gate trench 116. The source pad 146 additionally includes a second rectangular section 150 that is continuously connected to the first rectangular section 148 and extends over the inactive region 134. The second rectangular section 150 partially covers the resistor trenches 138 such that a first end 152 of the resistance section 140 is disposed directly underneath the second rectangular section 150 of the source pad 146 and such that a second end 154 of the resistance section 140 that is laterally opposite the first end 152 is uncovered from the source pad 146. That is, the second rectangular section 150 of the source pad 146 extends directly over a portion of the resistor trenches 138 while other portions of the source pad 146 remain exposed from the source pad 146.

In addition to the source pad 146, an electrically conductive gate pad 156 is formed in the first metallization layer 144. The gate pad 156 provides the gate terminal (G) of the device 100. The gate pad 156 can be formed over the inactive region 134. Elongated spans 158 of the first metallization layer 144 that are connected to the gate pad 156 and extend over the active device region 136 and form gate bus lines. These gate bus lines are used to bring the gate signal from the gate pad 156 to the gate electrode 118(s) of the power switching device 100.

An electrically conductive snubber bus line 160 is formed in the first metallization layer 144 in addition to the source metallization (i.e., the source pad 146) and the gate metallization (i.e., the gate pad 156 and the gate bus lines). The snubber bus line 160 is used to provide a low-ohmic connection between the field electrode 124 and the second end 154 of the resistance section 140. The electrically conductive snubber bus line 160 is laterally spaced apart from the source pad 146 and is electrically insulated from the source pad 146. Thus, the snubber bus line 160 provides an electrical connection between the inactive region 134 and the active device region 136 that is independent from the source pad 146. Electrical insulation between the snubber bus line 160 and source pad 146 can be provided by another interlayer dielectric material (not shown) such as an oxide or nitride.

According to an embodiment, the snubber bus line 160 continuously extends between a first location that is directly above the second end 154 of the resistance section 140, which is disposed in the resistor trench, 138 and a second location that is directly above the field electrode 124. Thus, the snubber bus line 160 provides a complete electrical path between the locations of the resistor 132 and the field electrode 124. According to a more particular embodiment, the snubber bus line 160 includes vertical (from the perspective of FIG. 4) spans and a horizontal (from the perspective of FIG. 4) span that are disposed at the periphery of the substrate 102. The snubber bus line 160 further includes at least one vertical elongated span 162 that is disposed in a center of the substrate 102 and runs parallel to the elongated spans of the gate bus. This central elongated span 162 of the snubber bus line 160 extends directly over portions of the field electrode 124.

Electrical connection between the first metallization layer 144 and the various nodes within the substrate 102 may be effectuated using electrically conductive via structures that vertically extend through the intermetal dielectric layer 143 from the main surface 104 to the first metallization layer 144. The via structures can be formed from any of a variety of electrically conductive materials including conductive metals, such as tungsten, copper, aluminum, as well as conductive semiconductors, such as highly doped polysilicon.

Figure 6:
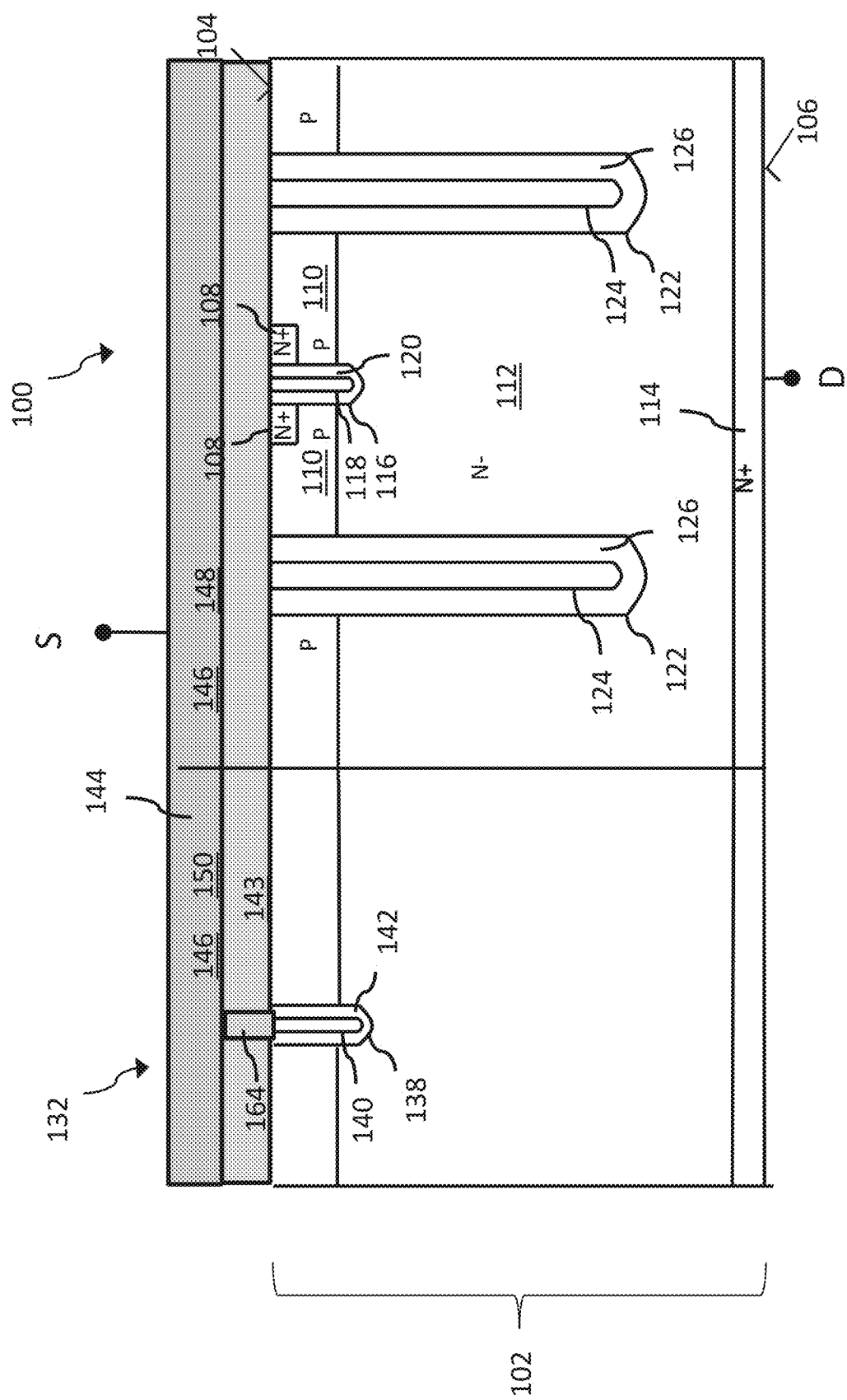
FIG. 6 illustrates a partial cross-sectional view of the substrate along the line I-I' shown in FIG. 5, according to an embodiment.

Referring to FIG. 6, the electrical connection between the source electrode and the resistance section 140 of the resistor 132 is depicted. This electrical connection is provided by a first via 164 that electrically connects the first end 152 (as shown in FIG. 5) of the resistance section 140 to the second rectangular section 150 of the source pad 146.

Figure 7:
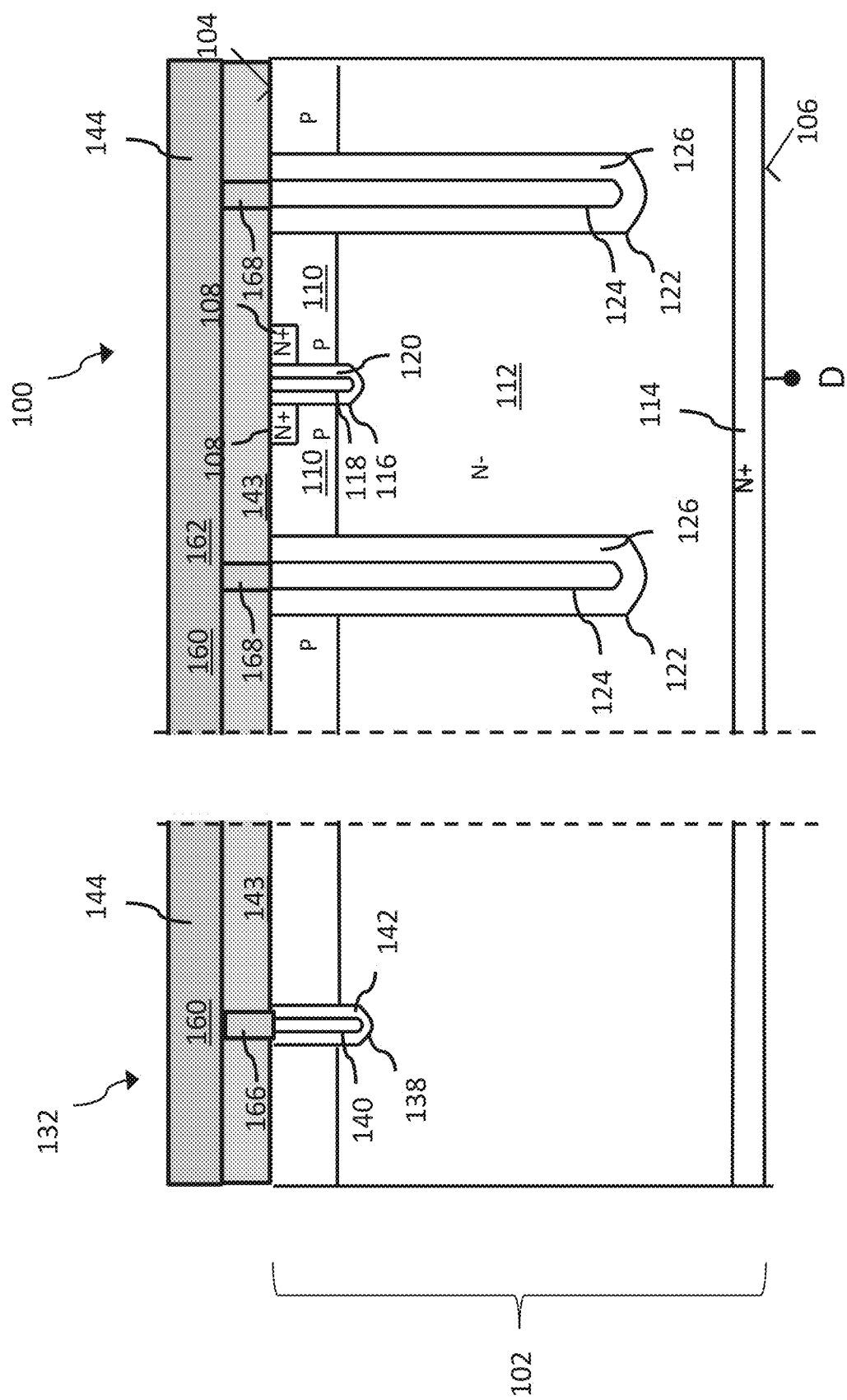
FIG. 7 illustrates a partial interrupted cross-sectional view of the substrate along the lines II-II' and III-III' shown in FIG. 5, according to an embodiment.

Referring to FIG. 7, the electrical connection between the snubber bus line 160 and the resistor 132 is depicted on the left side of the figure. This electrical connection is provided by a second via 166 that electrically connects the second end 154 (as shown in FIG. 5) of the resistance section 140 to the first location of the snubber bus line 160. In addition, the electrical connection between the snubber bus line 160 and the field electrode 124 is depicted on the right side of the figure. This electrical connection is provided by a third vias 168 that electrically connect the field electrode 124 to the elongated span 162 of the snubber bus line 160 that is disposed over the field electrode 124, i.e., the second location of the snubber bus line 160.

The source pad 146 may be electrically connected to the source region 108 and the gate pad 156 may be electrically connected to the gate electrode 118 using the via structures in a corresponding manner.

Figure 8:
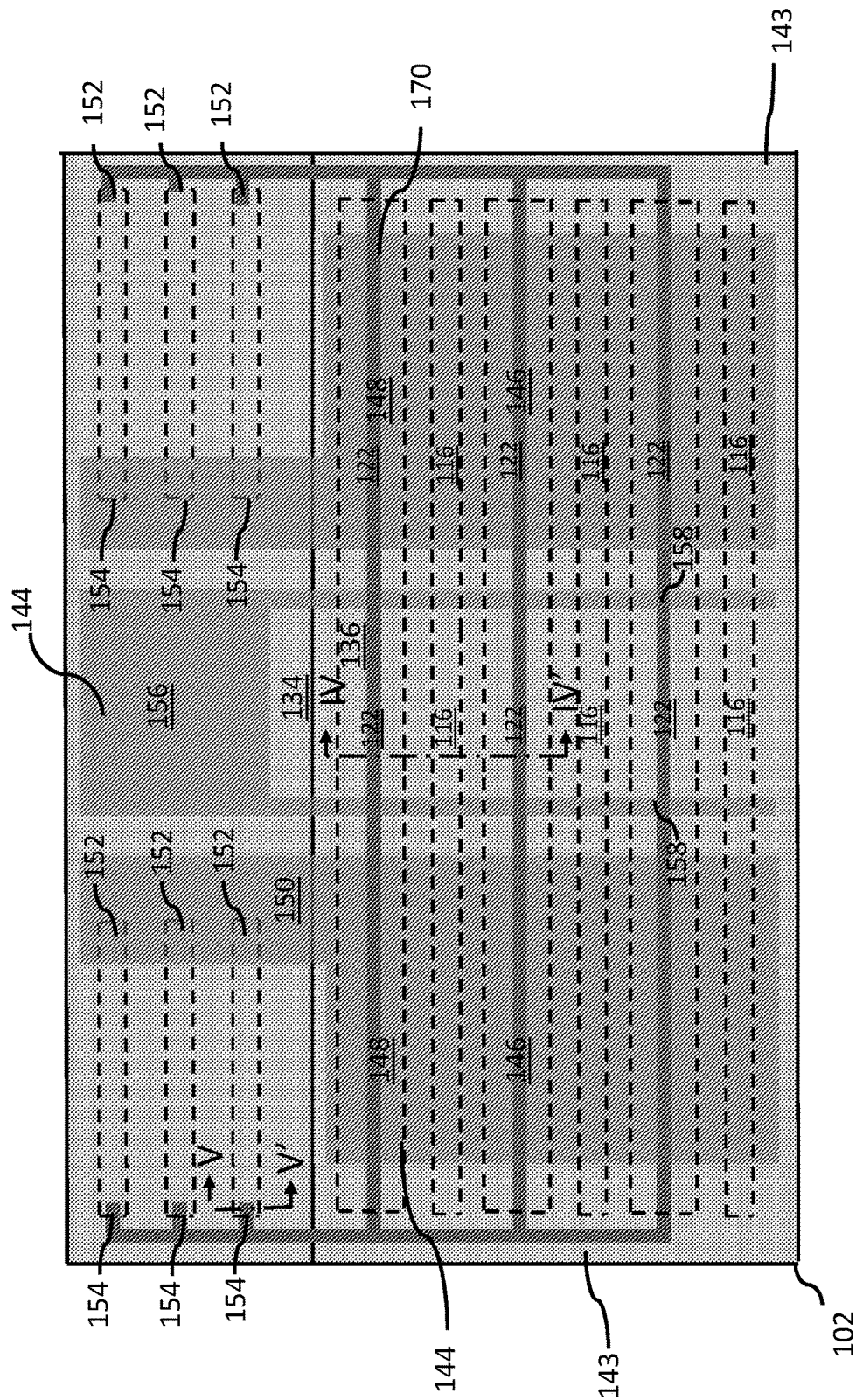
FIG. 8 illustrates a plan-view of the substrate depicted in FIG. 4 with an interlayer dielectric, a first metallization layer, and a conductive feedline that is disposed beneath the first metallization layer, according to an embodiment.
Figure 9:
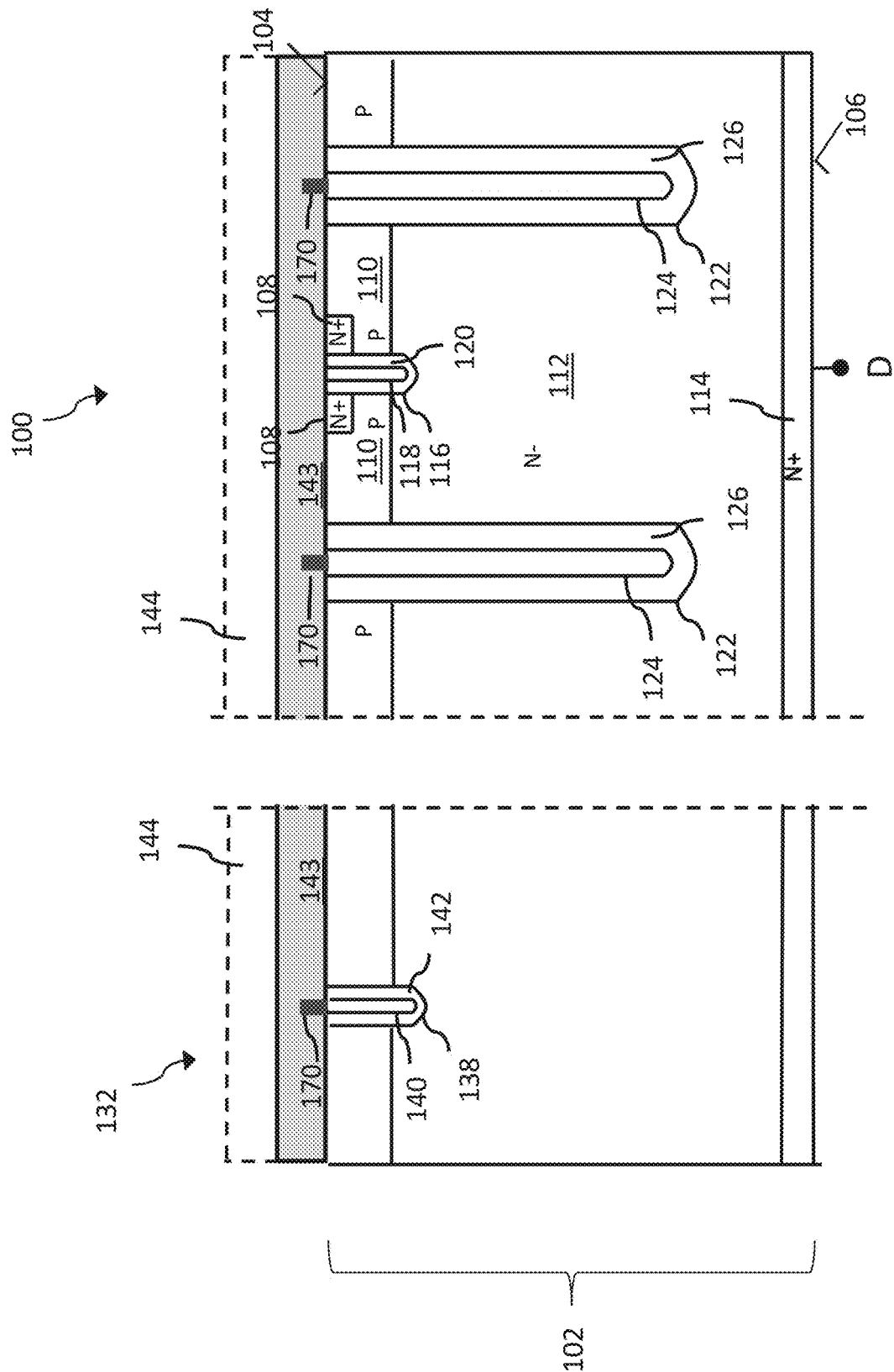
FIG. 9 illustrates a partial interrupted cross-sectional view of the device along the lines IV-IV' and V-V' shown in FIG. 8, according to an embodiment.

Referring to FIGS. 8-9, an alternative technique for providing a low-ohmic connection between the field electrode 124 second end 154 of the resistance section 140 is depicted, according to an embodiment. Different to the technique described with reference to FIGS. 5-7, this technique utilizes a conductive feedline 170 that is formed directly on the field electrode 124. The conductive feedline 170 can be formed from any of a variety of electrically conductive materials including conductive metals, such as tungsten, copper, aluminum, as well as conductive semiconductors, such as highly doped polysilicon. As the conductive feedline 170 makes direct contact with the field electrode 124, a low-ohmic connection exists between the field electrode 124 and the feedline.

As shown in FIG. 9, the conductive feedline 170 is disposed beneath the first metallization layer 144 and is insulated from the first metallization layer 144 by a portion of the intermetal dielectric layer 143 that covers the conductive feedline 170. Thus, the conductive feedline 170 does not electrically connect with the source pad 146 or the gate pad 156, and can provide a distinct electrical node from the source pad 146 and the gate pad 156.

Referring again to FIG. 8, in the depicted embodiment, the conductive feedline 170 extends continuously from the field electrode 124, which is disposed in the field electrode trench 122, to the second end 154 of the resistance section 140. That is, the conductive feedline 170 directly contacts the field electrode 124 and the resistance section 140 and additionally includes a section that travels from the inactive region 134 to the active device region 136, thus replacing the snubber bus line 160.

One advantage of the conductive feedline 170 technique described with reference to FIGS. 8-9 in comparison to the snubber bus line 160 technique described with reference to FIGS. 5-7 is the potential for reduced die area. As the snubber bus line 160 described with reference to FIGS. 5-7 is formed on the same level of metallization as the source and gate pads 146, 156, additional area is required so that the snubber bus line 160 has spatial clearance with the source and gate pads 146, 156. By contrast, the conductive feedline 170 can be formed directly underneath the source and gate pads 146, 156 and thus does not require any additional chip area.

One advantage of the snubber bus line 160 technique described with reference to FIGS. 5-7 in comparison to the conductive feedline 170 technique described with reference to FIGS. 8-9 is reduced processing steps. As the conductive feedline 170 described with reference to FIGS. 8-9 introduces an additional level of interconnect into the device, additional processing steps (e.g., masking, deposition, mask strip) and thus additional time and expense is required to form the conductive feedline 170. By contrast, the snubber bus line 160 is formed in the same layer of metallization as the source and gate pads 146, 156 and can therefore be formed simultaneously with these structures without any additional masking and deposition steps. In addition, the snubber bus line 160 technique described with reference to FIGS. 5-7 provides increased control over the resistance of the RC snubber 130 by controlling the number of parallel connections between the field electrode 124 and the second end 154 of the resistance section, The connection techniques described with reference to FIGS. 5-9 represent just two of a variety of techniques for providing a low-ohmic connection between the field electrode 124 and the second end 154 of the resistance section 140. Optionally, additional (purposeful) electrical resistance can be added between the source pad 146 and the field electrode 124. The depicted layouts represent just two possible layouts, and a variety of alternate layouts may be suitable for a given application or device configuration. Moreover, the conductive feedline 170 may be combined with the snubber bus line 160 in a variety of different configurations. For example, the conductive feedline 170 could be formed only on top of the field electrode 124, and a first metallization structure that is similar to the snubber bus line 160 could be used to connect the conductive feedline 170 to the second end 154 of the resistance section 140. In that case, electrical connection between the conductive feedline 170 and the first metallization can be effectuated in regions of the field electrode trench 122 that are not exposed from the source pad 146, such as the ends of the field electrode trenches 122 in the depicted embodiments.

Figure 10:
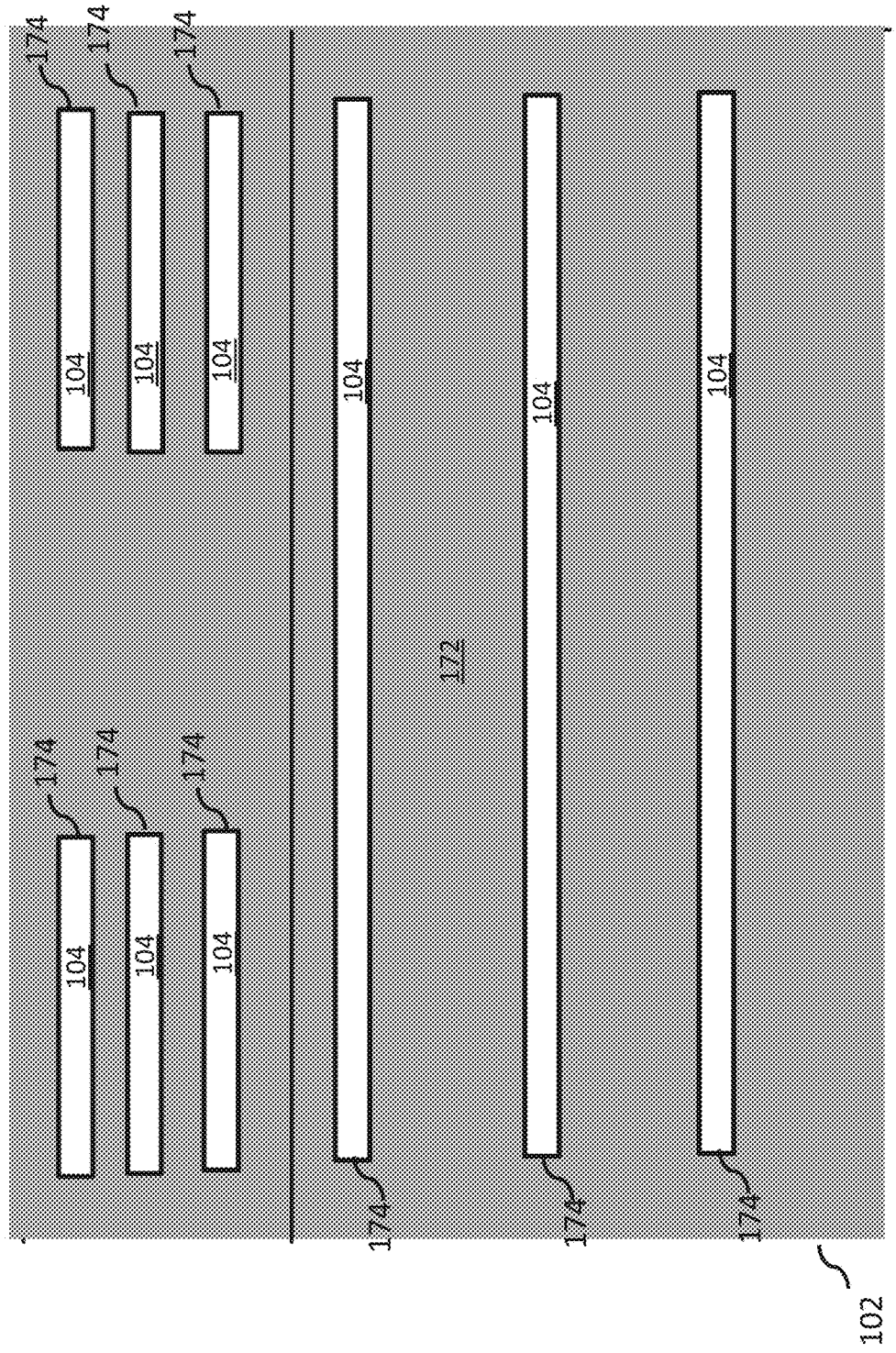
FIG. 10 a method of forming a device by using a patterned mask that is used to form the gate and resistor trenches, according to an embodiment.
Figure 11:
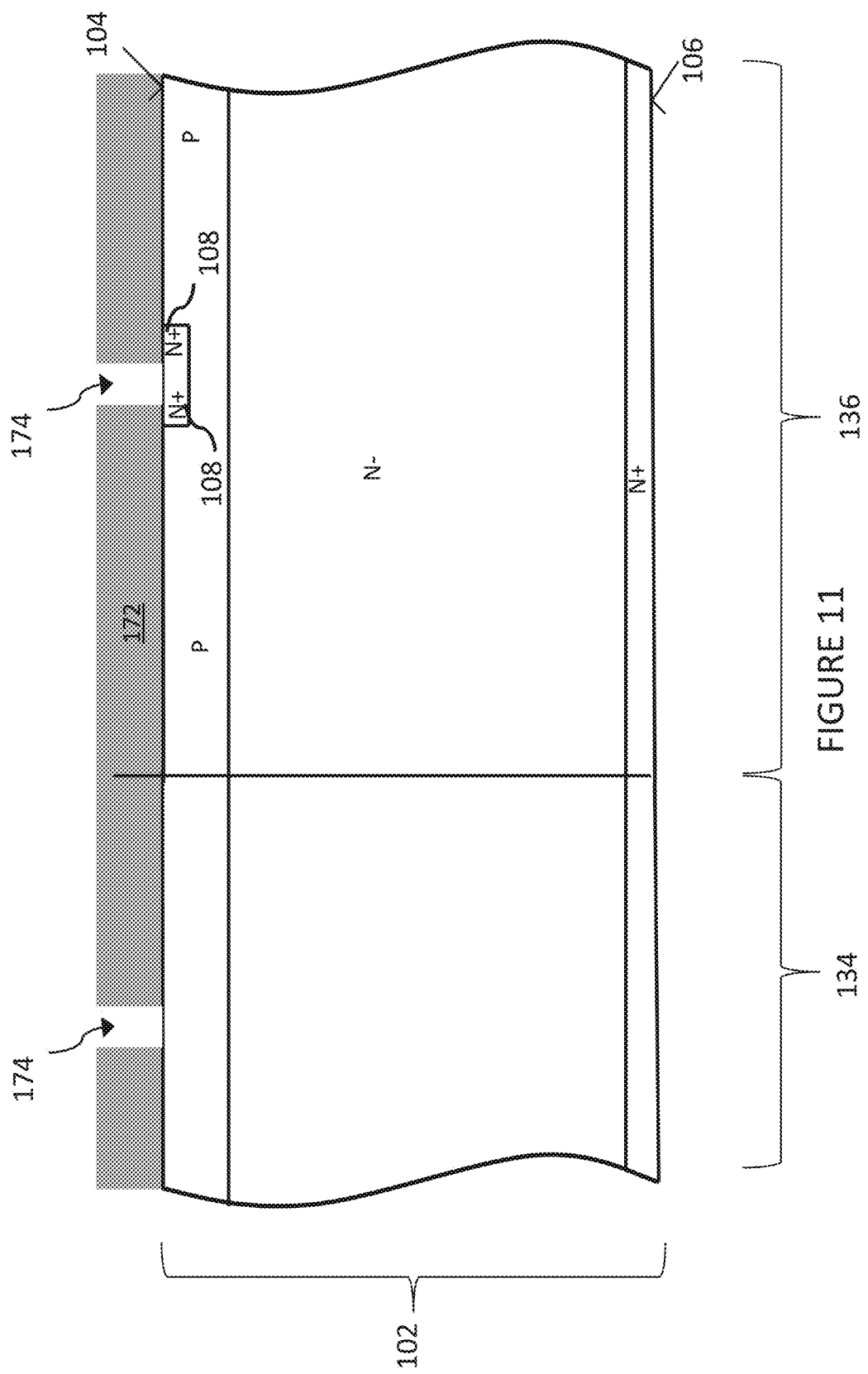
FIG. 11 illustrates a cross-sectional view of the substrate with the patterned mask before trench formation, according to an embodiment.
Figure 12:
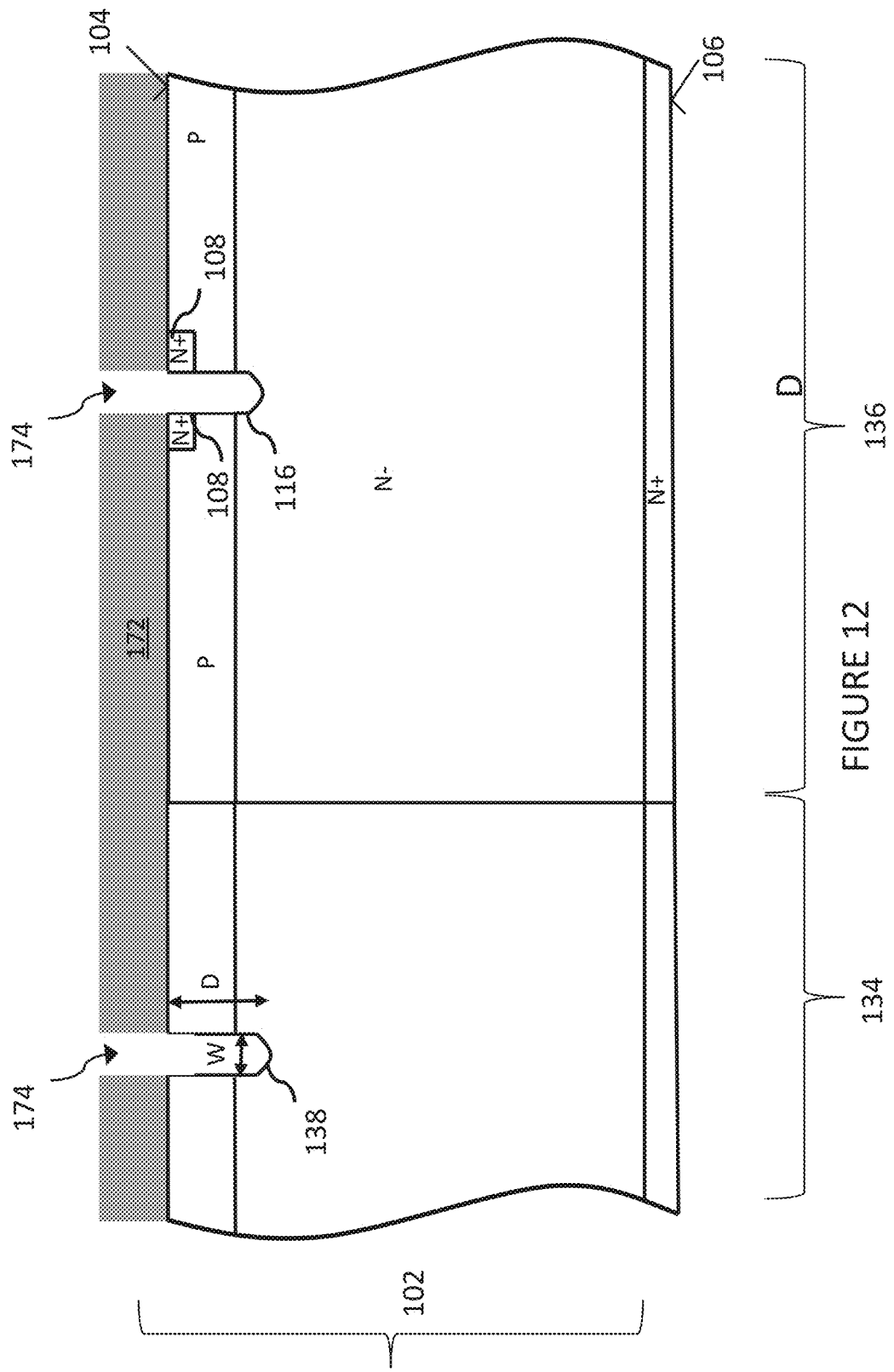
FIG. 12 illustrates a cross-sectional view of the substrate with the patterned mask after trench formation, according to an embodiment.

Referring to FIGS. 10-12, selected method steps for forming the semiconductor device are depicted. According to the method, the semiconductor substrate 102 is provided. The semiconductor substrate 102 is processed to include the source, body, drift and drain regions 108, 110, 112, 114. This may be done using conventionally known doping techniques. For example, the body and drain regions 108, 110 can be formed as doped layers by implanting or diffusing dopant atoms into the main and rear surfaces, 104, 106 respectively. The doping concentration of the drift region 112 can correspond to the intrinsic doping concentration of the substrate 102 or can be controlled during epitaxial growth. The source regions 108 can be formed using masking techniques to implant or diffuse dopant atoms into selected portions of the body region 110, According to an embodiment, the source regions 108 are formed only in the active device region 136 and the inactive region 134 is devoid of the source regions 108.

Subsequently, a patterned mask 172 is formed on the main surface 104 of the substrate 102. The patterned mask 172 can be formed according to any of a variety of known photolithography techniques. The patterned mask 172 is formed over the active device region 136 and the inactive region 134. The patterned mask includes openings 174 that are dimensioned in the shape of the gate trenches 116 and the resistor trench 138. In the active device region 136, the openings 174 are provided over the source regions 108.

Subsequently, as shown in FIG. 12, semiconductor material is removed from portions of the substrate 102 that are exposed by the patterned mask 172. This may be done by an anisotropic etching process, for example.

The remaining features of the semiconductor device (e.g., the gate electrode 118, gate dielectric 120, field electrode 124, field electrode dielectric 126, intermetal dielectric layer 143, the first metallization layer 144, etc.) can be formed according to commonly known techniques, for example.

By using a common lithography step to form the gate trenches 116 and the resistor trenches 138 simultaneously, the width (W) (as measured between opposing sidewalls) and depth (D) (as measured from the main surface 104 to the bottom of the trench) of the resistor trench 138 is highly controllable. The process used to form the gate trenches 116 is highly developed with respect to the critical dimensions that substantially impact the performance of the semiconductor device, including the width and depth of the gate trench 116. That is, the process is capable of producing gate trenches 116 of certain width and depth within a very narrow tolerance range. Advantageously, this high degree of control with respect to the width and depth of the gate trench 116 is leveraged in the formation of the resistor 132. According to an embodiment, the resistor trench 138 has approximately the same width (W) and depth (D) as the gate trench 116. As used herein, the term "approximately the same" means that the width and depth of the two trenches is nominally the same, and does not vary by more than process tolerances allow for.

After forming the resistor trench 138 and the gate trench 116, the field electrode trench 122 can be formed using a separate masked etching process. The field electrode trench 122 can be made to be wider and deeper than the gate trench 116. Thus, the process tolerances associated with the formation of the field electrode trench 122 are not determinative of the electrical properties of the resistance value ($R_{SNUBBER}$) of the RC snubber 130.

In the above described embodiments, the device 100 is an n-channel vertical MOSFET. This device type is used for exemplary purpose, and the embodiments are not limited to this device type. Alternatively, a variety of different device can be substituted for the device 100. For example, the conductivity type of the source, body, drift and drain regions 108, 110, 112, 114 may be reversed so that the device 100 is a p-channel MOSFET. The device 100 may be an enhancement mode or depletion mode device. Furthermore, the device 100 is not necessarily a MOSFET, and may be implemented as any other another kind of active semiconductor device such as a diode, thyristor, IGBT, etc. For example, the device can be configured as an insulated gate bipolar transistor (IGBT) by including an additional p-type collector region (not shown) at the rear surface 106, or as a diode by omitting the gate structure, Furthermore, the device may have a lateral conduction configuration instead of a vertical configuration. In that case, the gate electrode 118s and the field electrodes 124 can be provided in trenches or alternatively can be formed above the main surface 104 with dielectric insulators provided beneath them. In any of the above described device configurations, the resistor 132 and connection techniques described herein can be used to form an RC snubber 130 that is connected across the output of the device.

In the embodiments described herein, a single device 100 with a single resistor 132 is described for exemplary purposes only. Alternatively, a plurality of the switching devices 100 and/or a plurality of resistors 132 described herein can be combined in a single die. Moreover, different device types and different resistor configurations may be combined with one another.

As used herein, a "vertical direction" and corresponding directional descriptors such as "vertically extending" refer to a direction that is perpendicular to the main and rear surfaces 104, 106 of the substrate 102. A "lateral direction" and corresponding directional descriptors such as "laterally extending" refer to a direction that is parallel the main and rear surfaces 104, 106 of the substrate 102 and perpendicular to the vertical direction.

The term "electrically connected" describes a permanent low-ohmic connection between electrically connected elements, for example a direct contact between the concerned elements or a low-ohmic connection via a conductive metal and/or highly doped semiconductor. By contrast, the term "electrically coupled" accounts for the possibility that one or more intervening element(s) adapted for signal transmission (e.g., transistors, diodes, etc.) may be provided between the electrically coupled elements.

In this specification, some figures illustrate relative doping concentrations by indicating "−" or "+" next to the conductivity type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Spatially relative terms such as "under," "below," "lower," "over," "upper" and the like, are used for ease of description to explain the positioning of one element relative to a second element. These terms are intended to encompass different orientations of the device 100 in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor substrate comprising a main surface, a rear surface vertically spaced apart from the main surface, an active device region, and an inactive region that is laterally adjacent to the active device region;
a transistor cell in the active device region, the transistor cell comprising a gate trench and a pair of field plate trenches disposed on either side of the gate trench, the gate trench and the field plate trenches each being elongated and extending parallel to one another in a length direction of the trenches, the gate trench comprising an electrically conductive gate electrode that is configured to control a conductive connection between source regions that extend to the main surface and a drain region at the rear surface, the field plate trenches comprising electrically conductive field electrodes;
a resistor trench in the inactive region, the resistor trench comprising a resistance section that is disposed in the resistor trench beneath the main surface; and
a source pad and a field electrode connector formed in a first metallization layer over the main surface,
wherein the source pad comprises a narrower section that is disposed in the inactive region and extends over a first end of the resistor trench and exposes a second end of the resistor trench,
wherein the source pad comprises a wider section that is disposed in the active region and partially covers the gate trench and the pair of field plate trenches and exposes central regions of the gate trench and the pair of field plate trenches,
wherein the narrower and wider sections are continuously connected to one another,
wherein the narrower section of the source pad is directly electrically connected to the resistance section at the first end of the resistor trench,
wherein the wider section of the source pad is directly electrically connected to the source regions,
wherein the field electrode connector is directly connected to the resistance section at the second end of the resistor trench and is directly connected to the field electrodes at the central regions of the field plate trenches that are exposed from the source pad, and
wherein the field electrode connector is an elongated span of the first metallization layer that wraps around opposite facing edge sides of the wider section of the source pad.

2. The semiconductor device of claim 1, wherein the wider section of the source pad comprises first, second and third edge sides, the first and second edge sides being opposite from one another and extending transverse to sidewalls of the gate trench, the third edge side extending between the first and second edge sides, and wherein the field electrode connector wraps around the first, second and third edge sides.

3. The semiconductor device of claim 1, wherein the source pad extends continuously over the active device region and the inactive device region, wherein a section of the source pad in the inactive device region partially covers the resistor trench such that a first end of the resistance section is disposed directly underneath the source pad and such that a second end of the resistance section that is laterally opposite the first end is uncovered from the source pad.

4. The semiconductor device of claim 1, further comprising:
an electrically conductive gate pad formed in the first metallization layer; and
an electrically conductive gate bus formed in the first metallization layer and connected to the gate pad, the gate bus comprising one or more elongated spans of the first metallization layer that extend over the active device region and are in ohmic contact with the gate electrode.

5. The semiconductor device of claim 1, wherein the switching device comprises a gate trench that vertically extends from the main surface into the semiconductor substrate, and wherein the gate electrode is disposed in the gate trench.

6. The semiconductor device of claim 5, wherein the resistor trench has approximately the same width and depth as the gate trench.

7. The semiconductor device of claim 6, wherein the switching device further comprises a field electrode trench that vertically extends from the main surface into the semiconductor substrate, the field electrode trench being laterally spaced apart from the gate trench and being wider and deeper than the gate trench, and wherein the field electrode is disposed in the field electrode trench.

* * * * *